(12) United States Patent
Mahler et al.

(10) Patent No.: US 9,082,767 B2
(45) Date of Patent: *Jul. 14, 2015

(54) EMBEDDED INTEGRATED CIRCUIT PACKAGE AND METHOD FOR MANUFACTURING AN EMBEDDED INTEGRATED CIRCUIT PACKAGE

(71) Applicant: Infineon Technologies AG, Neubiberg (DE)

(72) Inventors: Joachim Mahler, Regensburg (DE); Edward Fuergut, Dasing (DE); Khalil Hosseini, Weihmichl (DE); Georg Meyer-Berg, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/151,917

(22) Filed: Jan. 10, 2014

(65) Prior Publication Data
US 2014/0151862 A1  Jun. 5, 2014

Related U.S. Application Data

(63) Continuation of application No. 13/551,656, filed on Jul. 18, 2012, now Pat. No. 8,648,456.

(51) Int. Cl.
| | |
|---|---|
| *H01L 21/56* | (2006.01) |
| *H01L 23/498* | (2006.01) |
| *H01L 23/48* | (2006.01) |
| *H01L 23/28* | (2006.01) |
| *H01L 21/58* | (2006.01) |
| *H01L 23/00* | (2006.01) |
| *H01L 23/538* | (2006.01) |

(52) U.S. Cl.
CPC ........ *H01L 23/49811* (2013.01); *H01L 21/561* (2013.01); *H01L 21/58* (2013.01); *H01L 23/5389* (2013.01); *H01L 24/19* (2013.01); *H01L 24/97* (2013.01); *H01L 2224/04105* (2013.01); *H01L 2224/32245* (2013.01); *H01L 2224/73267* (2013.01); *H01L 2224/92244* (2013.01); *H01L 2224/97* (2013.01)

(58) Field of Classification Search
USPC .......................... 257/737, 774, 676, 666, 773
See application file for complete search history.

(56) References Cited

U.S. PATENT DOCUMENTS 8,648,456 B1 *  2/2014  Mahler et al. ................. 257/690

* cited by examiner

*Primary Examiner* — Vongsavanh Sengdara
*Assistant Examiner* — Thai T Vuong

(57) ABSTRACT

A embedded integrated circuit package is provided, the embedded integrated circuit package including: at least one chip arranged over a chip carrier, the at least one chip including a plurality of chip contact pads; encapsulation material formed over the chip carrier and at least partially surrounding the at least one chip; a plurality of electrical interconnects formed through the encapsulation material, wherein each electrical interconnect is electrically connected to a chip contact pad; and a structure formed between the electrical interconnects of the embedded integrated circuit package, wherein the structure increases the creepage resistance between the electrical interconnects.

20 Claims, 7 Drawing Sheets

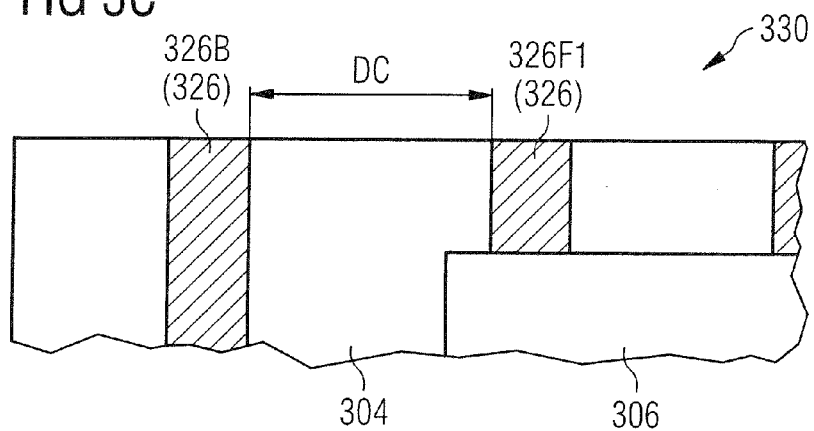
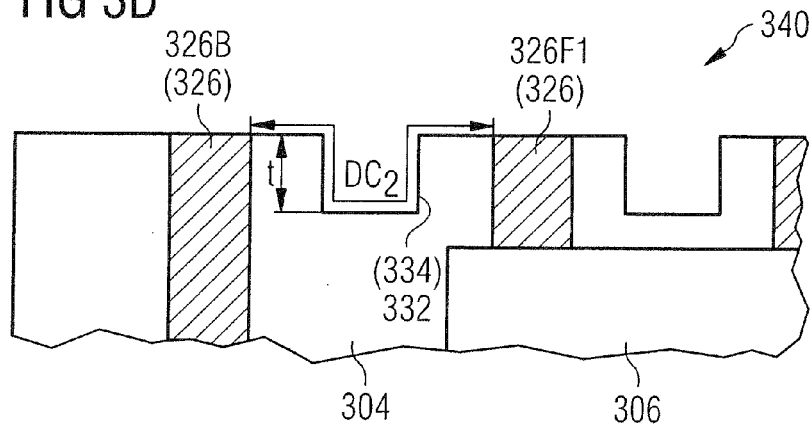
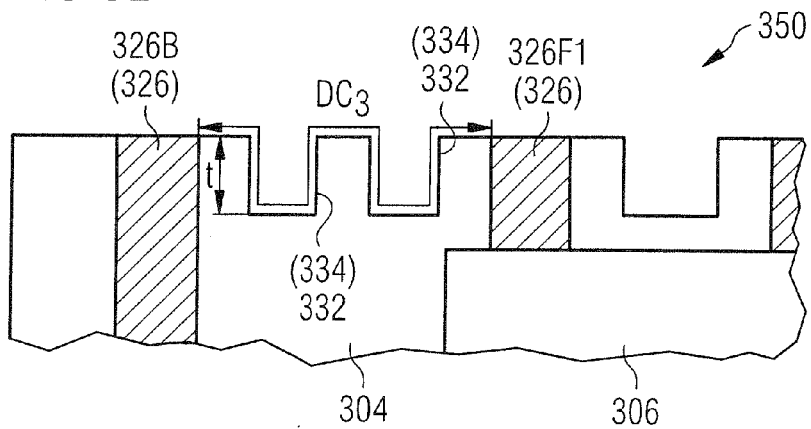

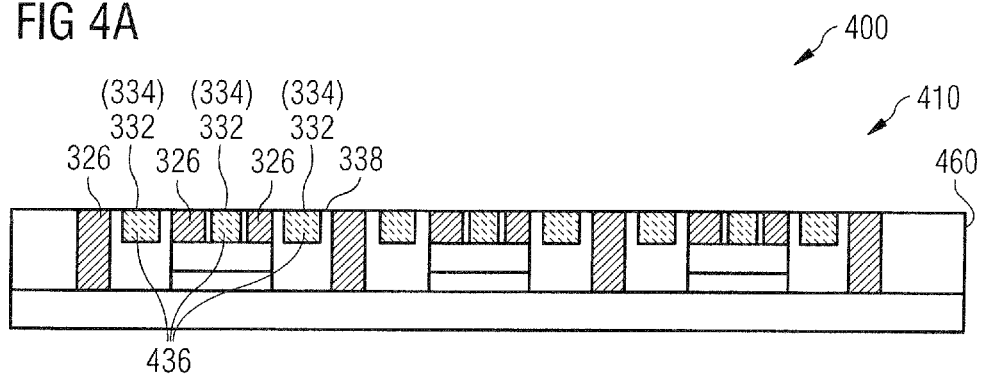
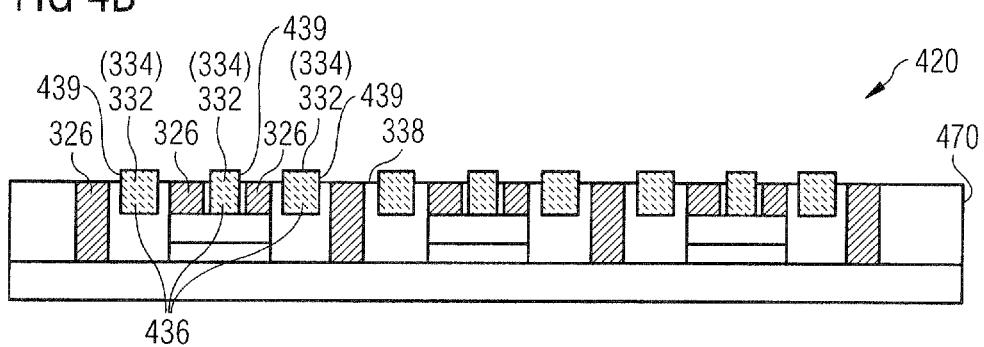
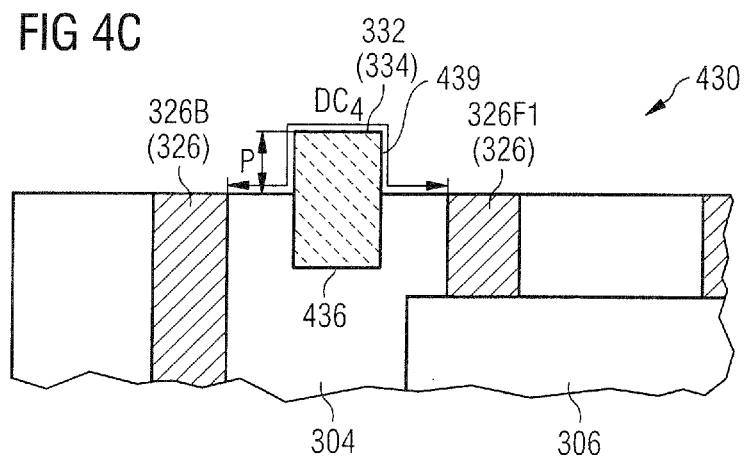

EMBEDDED INTEGRATED CIRCUIT PACKAGE AND METHOD FOR MANUFACTURING AN EMBEDDED INTEGRATED CIRCUIT PACKAGE

CROSS REFERENCE TO RELATED APPLICATION

This application is a continuation of U.S. patent application Ser. No. 13/551,656, which was filed Jul. 18, 2012. This application is incorporated herein by reference in its entirety.

TECHNICAL FIELD

Various embodiments relate generally to an embedded integrated circuit package and a method for manufacturing an embedded integrated circuit package.

BACKGROUND

Various challenges are associated with manufacturing high voltage housings at wafer level and exist for the production of semiconductor power modules. Normally, organic polymer materials may be used for component encapsulation, for example, the encapsulation of integrated circuit chips (ICs). These organic polymer materials may exhibit a limited dielectric strength and creep resistance. These electrical parameters may suffer or decrease significantly, especially in combination with moisture. As a result, chip-housings, for example, for high-voltage applications, may have restricted or limited usability.

FIGS. 1A and 1B show chip packages 110, 120, which may include transistor outline (TO)-housing packages, such as DPAK and D2 Pak. Grooves 102 may be manufactured in mold material 104 to increase creepage resistance.

SUMMARY

Various embodiments provide an embedded integrated circuit package including: at least one chip arranged over a chip carrier, the at least one chip including a plurality of chip contact pads; encapsulation material formed over the chip carrier and at least partially surrounding the at least one chip; a plurality of electrical interconnects formed through the encapsulation material, wherein each electrical interconnect is electrically connected to a chip contact pad; and a structure formed between the electrical interconnects of the embedded integrated circuit package, wherein the structure increases the creepage resistance between the electrical interconnects.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3E show a method for manufacturing an embedded integrated circuit package according to an embodiment;
FIGS. 4A to 4C show a method for manufacturing an embedded integrated circuit package according to an embodiment.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide a method for of manufacturing chip housings for high voltage applications, e.g. chips capable of carrying voltages larger than 300 V, at wafer level.

Various embodiments provide a method for manufacturing packages for high voltage chip, wherein complete component preparation may be realized at wafer level.

Various embodiments provide a wafer-level package and/or chip package, e.g. a leadless package, wherein grooves and/or structures may be formed in the encapsulation mass between the chip interconnects.

Various embodiments provide a wafer-level package and/or chip package, e.g. a leadless package, wherein creepage strength materials such as glass and/or ceramic elements may be formed for increasing the dielectric strength and/or creepage resistance between chip interconnects, for example, they may be formed in the grooves.

Various embodiments provide a wafer-level package and/or chip package, e.g. a leadless package, wherein one or more protrusions, e.g. including creepage strength materials, may be formed in the encapsulation mass between the chip interconnects, wherein creepage resistance of the components, e.g. between the chip interconnects, may be significantly increased.

Figure 1A:
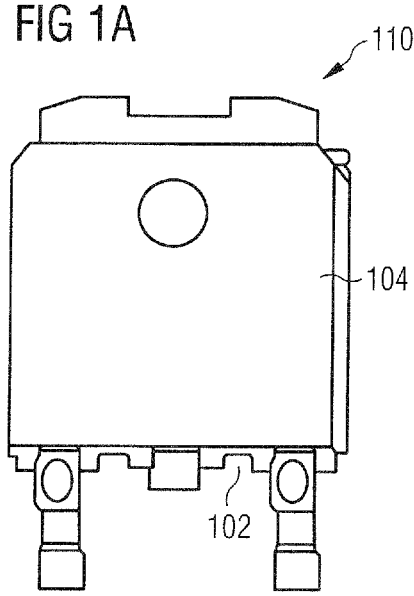
FIGS. 1A and 1B show chip packages.
Figure 1B:
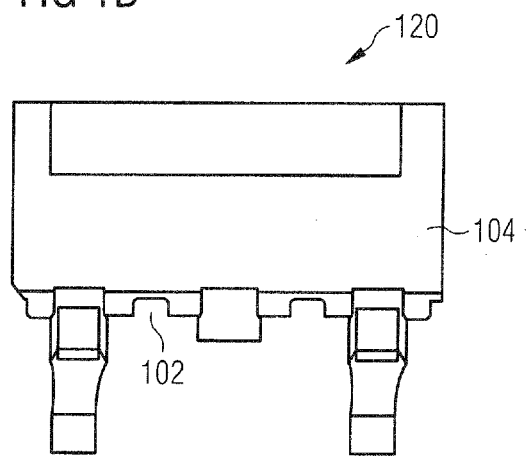
Figure 2:
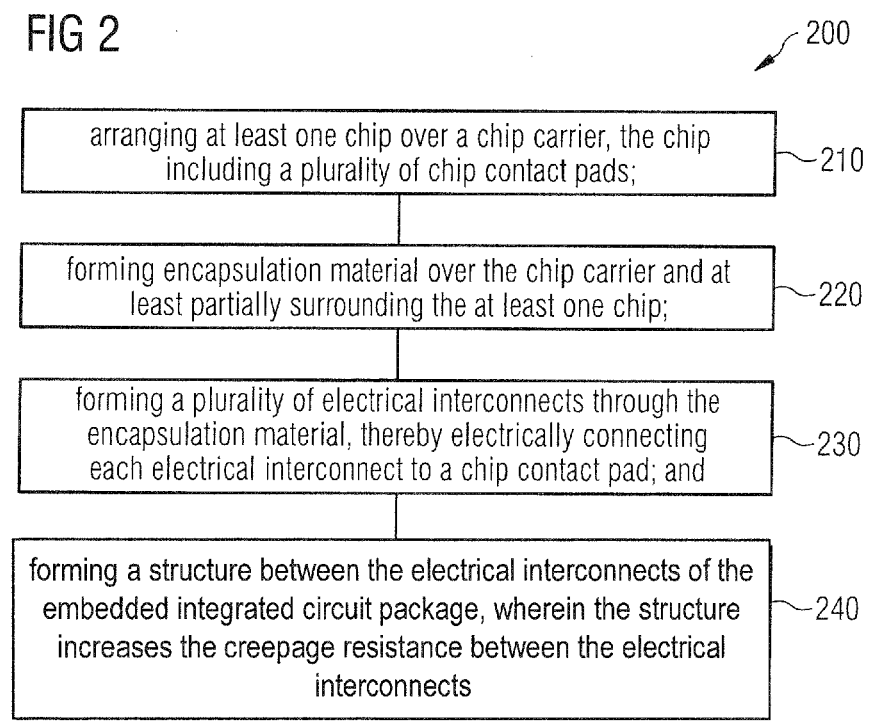
FIG. 2 shows a method for manufacturing an embedded integrated circuit package according to an embodiment.

FIG. 2 shows method 200 for manufacturing a chip package according to an embodiment.

Method 200 may include:
arranging at least one chip over a chip carrier, the chip including a plurality of chip contact pads (in 210);
forming encapsulation material over the chip carrier and at least partially surrounding the at least one chip (in 220);
forming a plurality of electrical interconnects through the encapsulation material, thereby electrically connecting each electrical interconnect to a chip contact pad (in 230); and forming a structure between the electrical interconnects of the embedded integrated circuit package, wherein the structure increases the creepage resistance between the electrical interconnects (in 240).

FIGS. 3A to 3E shows method 300 for manufacturing an embedded integrated circuit package according to various embodiments.

An embedded integrated circuit package may include a chip package, for example, a wafer level package.

Figure 3A:
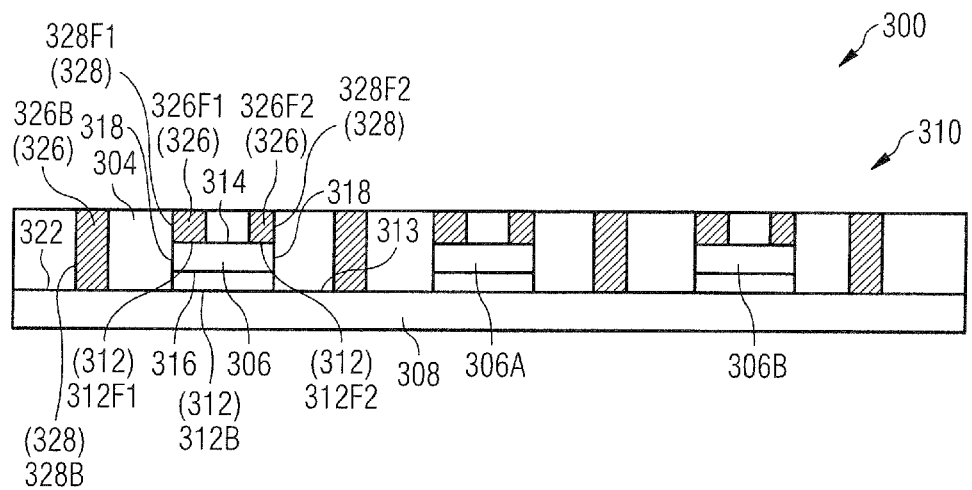

As shown in FIG. 3A, method 300 may include arranging at least one chip 306 over chip carrier 308, wherein at least one chip 306 may include a plurality of chip contact pads 312.

Chip 306 may include a semiconductor chip, e.g. a die, which may include one or more electronic components formed over a wafer substrate. The chip 306, e.g. the wafer, may include various materials, e.g. semiconductor materials. The wafer substrate may include at least one from the following group of materials, the group of materials consisting of: Silicon, Germanium, Group III to V materials, polymers, doped or undoped silicon, semiconductor compound material, e.g. gallium arsenide (GaAs), indium phosphide (InP), quaternary semiconductor compound material, e.g. indium gallium arsenide (InGaAs), silicon on insulator (SOI).

Chip 306 may include a power semiconductor chip. For example, chip 306 may be capable of carrying voltage from between 300V up to approximately 10 000 V.

Chip 306 may include a plurality of chip contact pads 312, for example, front side contact pads, 312F1, 312F2 and at least one back side contact pad 312B. Front side contact pads, 312F1, 312F2 may be formed over first chip side 314, e.g. top side, e.g. upper side. At least one back side contact pad 312B may be formed over second chip side 316, e.g. back side, e.g. bottom side. Plurality of chip contact pads 312 may include electrically conductive pads, which may include at least one material, element or alloy from the following group of materials, the group consisting of: copper, aluminum, silver, tin, gold, palladium, zinc, nickel, iron.

Chip front side may also be referred to as a "first chip side", "chip top side" or "chip upper side", which may be used interchangeably hereinafter. Chip back side may also be referred to as "second chip side", "chip bottom side" or "chip lower side", which may be used interchangeably hereinafter.

Chip 306 may be arranged over chip carrier 308, e.g. chip 306 may be adhered, or joined, or fixed to chip carrier 308 via second chip side 316, e.g. chip back side. Chip 306 may include chip back side contact pad 312B, i.e. chip back side metallization, formed on second chip back side 316; and chip back side contact pad 312B may be adhered, or joined or fixed to chip carrier 308, for example, via electrically conductive adhesives, soldering or sintering.

Chip carrier 308 may include an electrically conductive leadframe. Therefore, an electrical connection may be formed between back side contact pad 312B and chip carrier 308.

It may be understood that for the sake of brevity, various embodiments are described only with respect to a single chip 306. However, it may be understood that various embodiments may apply to manufacturing an embedded integrated circuit package including a plurality of chips, e.g. batch processing of more than one chip, e.g. 306, 306A, 306B. In other words, the manufacturing of an integrated circuit package, e.g. chip package, according to method 300 may be applied to batch processing of a wafer level chip package, wherein a plurality of chips are packaged according to method 300, for example over a common continuous chip carrier 308; and individualized in the final stages of processing.

Encapsulation material 304 may be formed over chip carrier 308 and at least partially surrounding chip 306. Encapsulation material 304 may generally be deposited to encapsulate and/or electrically insulate chip 306. Encapsulation material 304 may be formed on chip carrier 308, e.g. on chip carrier top surface 313 and on one or more sidewalls 318 of chip 306.

In 310 of FIG. 3A encapsulation material 304 may substantially, e.g. substantially fully, cover first chip side 314. Subsequently, a plurality of electrical interconnects 326 may be formed through encapsulation material 304. Each electrical interconnect 326 may be electrically connected to a chip contact pad 312.

Encapsulation material 304 may be electrically insulating, and may electrically insulate plurality of electrical interconnects 326 from each other. According to some embodiments, encapsulation material 304 may include a mold compound which may be deposited, e.g. using molding methods. According to other embodiments, encapsulation material 304 may be deposited by lamination. Therefore, encapsulation material 304 may include an electrically insulating laminate, e.g. one or more laminate sheets. Encapsulation material 304 may include an electrically insulating laminate including at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Plurality of electrical interconnects 326 may be formed by at least partially filling plurality of holes 328, also referred to as vias, e.g. 328F1, 328F2, 328B. Plurality of holes 328, e.g. 328F1, 328F2, 328B may be formed in encapsulation material 304, each hole 328 thereby releasing an electrical contact electrically connected to a chip contact pad 312. For example, hole 328B may release a portion of chip carrier 308, e.g. top surface 322 of chip carrier 308. Hole 328F1 and 328F2 may release, e.g. expose, chip contact pads 312F1 and 312F2 from encapsulation material.

Plurality of electrical interconnects 326 may be formed, e.g. electroplated, in the holes 328. First electrical interconnect 326F1, e.g. in hole 328F1, may be electrically connected to first chip contact pad 312F1 formed on a first chip side; second electrical interconnect 326F2, e.g. in hole 328F2, may be electrically connected to second chip contact pad 312F2 is formed on first chip side 314; and third electrical interconnect 326B, e.g. in hole 328B, may be electrically connected to third chip contact pad 312B formed on second chip side 316 via chip carrier 308, wherein second chip side 316 may be formed on chip carrier 308.

Plurality of electrical interconnects 326 may be formed over at least one of chip 306 and chip carrier 308. For example, first electrical interconnect 326F1 may be formed over, e.g. directly over, chip contact pad 312F1; and second electrical interconnect 326F2 may be formed over, e.g. directly over, chip contact pad 312F2. Therefore, first electrical interconnect 326F1 and second electrical interconnect 326F2 may be formed over chip 306. Third electrical interconnect 326B may be formed over top side 322 of chip carrier 308, and directly connected to chip carrier 308.

Plurality of electrical interconnects 326 may be formed, for example by filling of holes 328, with electrically conductive material, such as electroplating, e.g. galvanic electroplating. Plurality of electrical interconnects 326 may include at least one material, element or alloy from the following group of materials, the group consisting of: copper, aluminum, silver, tin, gold, palladium, zinc, nickel, iron. It may be understood, that the eventual embedded integrated circuit package and/or chip package, may therefore include a leadless package, in that wire-bonding may not be present in the packages. It may be understood however that deposition of plurality of electrical interconnects 326 may not be limited to electroplating, e.g. galvanic electroplating, and may include deposition methods, e.g. sputtering, evaporation, electroless plating.

Figure 3B:
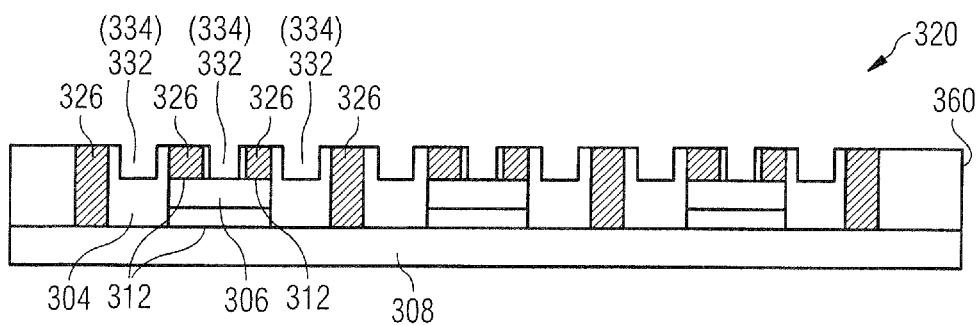

In 320 of FIG. 3B, structure 332 may be formed between electrical interconnects 326 of the embedded integrated circuit package, wherein structure 332 may increase the creepage resistance between electrical interconnects 326.

As shown in FIG. 3B, structure 332 may include cavity 334 formed in encapsulation material 304. Structure 332, e.g. cavity 334 of structure 332, may increase the creepage distance, measured along the surface of encapsulation material 304, between electrical interconnects 326. Cavities 334 may be formed in encapsulation material 304, e.g. in bumps in the laminate foil, and/or for example, through laser structuring or photolithographic etching of encapsulation material 304.

FIG. 3B shows an embedded integrated circuit package 360 according to an embodiment. Embedded integrated circuit package 360 may include: at least one chip 306 arranged over chip carrier 308, the at least one chip 306 including a plurality of chip contact pads 312; encapsulation material 304 formed over chip carrier 308 and at least partially surrounding the at least one chip 306; a plurality of electrical interconnects 326 formed through encapsulation material 304, wherein each electrical interconnect 326 may be electrically connected to a chip contact pad 312; and structure 332 formed between electrical interconnects 326 of embedded integrated circuit package 360, wherein structure 332 may increase the creepage resistance between electrical interconnects 326. Structure 332 may be formed over at least one of chip 306 and chip carrier 308.

It may be understood that creepage distance may defined as the shortest distance on the surface of an insulating material, e.g. encapsulation material 304, between two conductive elements, e.g. between 328F1 and 328F2; or between 328F1 and 328B. It may be understood that a voltage applied between 328F1 and 328B may be much higher than a voltage applied between 328F1 and 328F2, as a result, it may be critical that the creepage distance between 328F1 and 328B is large enough to prevent and/or avoid tracking.

FIGS. 3C to 3E show creepage distance, measured along the surface of encapsulation material 304, between electrical interconnects 326, without and with structure 332 according to various embodiments. As shown in FIG. 3C, the creepage distance (without structure 332), measured along the surface of encapsulation material 304 may be Dc.

FIG. 3D, shows formation of structure 332, e.g. cavity 334, at the surface 338 of encapsulation material 304. The creepage distance measured along the surface of encapsulation material 304 may be increased to Dc2. Dc2 may be larger than Dc (without structure 332) by approximately twice the cavity depth, t from encapsulation material surface 338.

As shown in FIG. 3E, structure 332 may not only include only one cavity 334, formed between electrical interconnects 326, but may include a plurality of cavities 332, e.g. more than one cavity 334, formed between electrical interconnects. A greater creepage distance Dc3 may be achieved.

FIG. 4. shows embedded integrated circuit package 460 according to an embodiment. Embedded integrated circuit package 460 may be manufactured according to method 400, wherein method 400 in addition to one or more or all of the processes described with respect to method 300, may further include forming further material 436 over at least one of chip 306 and chip carrier 308, further material 436 having a higher dielectric strength and/or higher comparative tracking index (CTI) than encapsulation material 304. Comparative tracking index may be measured according to a testing method according to IEC standard 60112 on a method for the determination of the proof and the comparative tracking indices of solid insulating materials. CTI may measure the tendency of electrical breakdown on the surface of an insulating material. An insulation material having a larger CTI may be less likely to experience leakage of conductive charges across the surface of the material. Further material 436 may for example exhibit high temperature stability greater than 300° C., high dielectric strength, large creepage resistance, stable dielectric strength and creepage strength, independent of external conditions, e.g. moisture, e.g. temperature. Therefore, higher component reliability may be achieved and applied to a large range of electronic components.

Further material 436 may include an electrically insulating material. Further material 436 may include at least one material from the following group of materials, the group of materials consisting of: glass, ceramics. Further material 436 may include higher temperature stability than encapsulation material 304. Further material 436 may include higher dielectric strength, than encapsulation material 304. Further material 436 may include larger creepage resistance than encapsulation material 304.

Further material 436 may be formed between electrical interconnects 312. Further material 436 may at least partially fill cavity 334, e.g. cavities 334. For example, further material 436 may substantially fill cavities 334 (as shown in embedded integrated circuit package 460). Therefore, embedded integrated circuit package 460 may include one or more ceramic and/or glass filled grooves, between electrical interconnects 326. According to another embodiment, further material 436 may form protrusion 439 of further material 436 from encapsulation material 304, as shown in embedded integrated circuit package 470 of FIG. 4B.

As shown in FIG. 4C, protrusion 439 may have a height p, extending approximately 500 nm to about 1000 μm from encapsulation material top surface 338. Furthermore protrusion 439 may increase the creepage distance measured along the surface of electrical insulation material between electrical interconnects 326 to Dc4. It may be understood that the electrical insulation material between electrical interconnects 326 may include at least part of encapsulation material 304 and further material 436. Therefore, Dc4 may be larger than Dc (without structure 332) by approximately twice the protrusion height, p. Furthermore, the use of further material 436 in cavities 334, e.g. glass or ceramic-filled grooves or cavities 334 between electrical interconnects 326, wherein further material 436 may have a higher dielectric strength and/or higher comparative tracking index than encapsulation material 304 may further improve the overall creepage resistance between electrical interconnects 326.

Figure 5A:
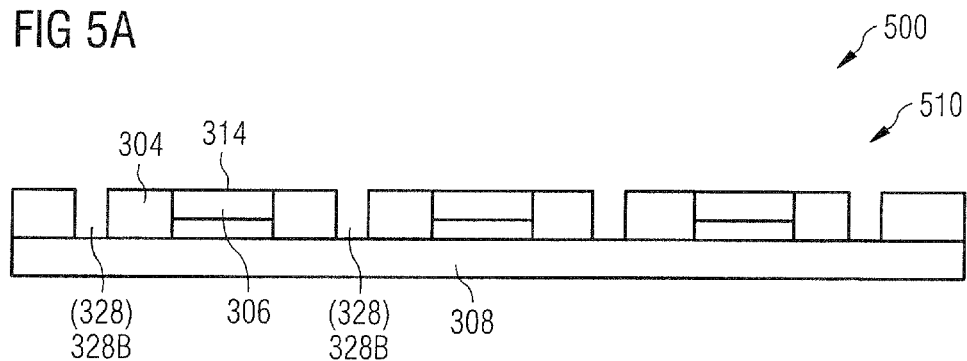
FIGS. 5A to 5C show a method for manufacturing an embedded integrated circuit package according to an embodiment.
Figure 5B:
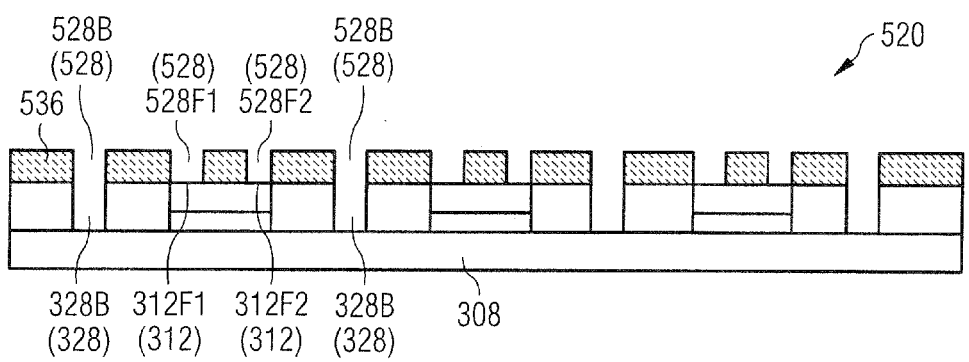
Figure 5C:
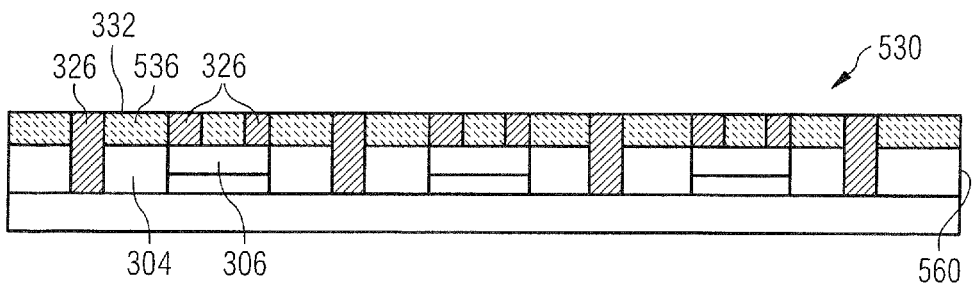

FIGS. 5A to 5C show method 500 for manufacturing an embedded integrated circuit package according to an embodiment. Method 500 may include one or more of the features already described with respect to methods 300 and 400.

As shown in FIG. 5A, method 500 may include arranging at least one chip 306 over chip carrier 308, wherein at least one chip 306 may include a plurality of chip contact pads 312. This may be carried out as described according to method 300 (FIG. 3A).

Encapsulation material 304 may be formed over chip carrier 308 and at least partially surrounding chip 306 as described with respect to method 300. Encapsulation material 304 may include an electrically insulating laminate and may be deposited by lamination as described according to method 300, for example, a single-sided lamination of integrated circuit chip 306 may be carried out on a metallic chip carrier 304. However, with respect to method 500, encapsulation material 304 may be deposited substantially on one or more sidewalls 318 of chip 306, and optionally, not on first chip side 314. Subsequently, chip 306 may be covered with enclosed, structured isolation material, i.e. further material 536, over encapsulation mass 304.

In preparation for the formation of electrical interconnects 326, plurality of holes 328, e.g. 328B, may be formed in encapsulation material 304, each hole 328 thereby releasing an electrical contact electrically connected to a chip contact pad 312. For example, hole 328B may release a portion of chip carrier 308, e.g. top surface 322 of chip carrier 308.

Subsequently, in 520, further material 536 (analogous to further material 436) may be formed over encapsulation material 304, further material 536 including glass and/or ceramic and/or high CTI electrically insulating material.

Furthermore, further material 536, including structured glass and/or ceramic regions, may be further structured, wherein one or more holes 528 may be formed in further material 536. For example, hole 528B may be formed over hole 328B. Furthermore, hole 528F1 and 528F2 may release, e.g. expose, chip contact pads 312F1 and 312F2 from encapsulation material.

It may be understood that processes 510 and 520 may be combined according to process requirements. For example, holes 528 in further material 536 and encapsulation material 304 may be formed in separate processes as described above according to various embodiments, or may be formed in single process, for example, after deposition of both encapsulation material 304 and further material 536.

Subsequently, in 530, a plurality of electrical interconnects 326 may be formed through encapsulation material 304 and further material 536. Each electrical interconnect 326 may be electrically connected to a chip contact pad 312. Plurality of electrical interconnects 326 may be formed, e.g. electroplated, as described according to method 300, and may be electrically connected to chip 306 and/or chip carrier 308 as described according to method 300 in 320. For example, holes 328,528 may be filled, e.g. plated using a single step plating or two-step plating process. For example, plating may be carried out first in holes 328, before formation of further material 536 followed by plating in holes 528 (single step plating); or plating may be carried out in holes 328, 528 in single step after formation of holes 528 in further material 536 (two-step plating).

It may be understood that further material 536 may be formed between electrical interconnects 326 as shown in FIG. 5C. FIG. 5B shows an embedded integrated circuit package 560 according to an embodiment. Embedded integrated circuit package 560 may include: at least one chip 306 arranged over chip carrier 308, the at least one chip 306 including a plurality of chip contact pads 312; encapsulation material 304 formed over chip carrier 308 and at least partially surrounding the at least one chip 306; a plurality of electrical formed through encapsulation material 304, wherein each electrical interconnect 326 may be electrically connected to a chip contact pad 312; and structure 332 formed between electrical of embedded integrated circuit package 360, wherein structure 332 may increase the creepage resistance between electrical interconnects 326. Structure 332 may be formed over at least one of chip 306 and chip carrier 308.

As shown in FIG. 5C, structure 332 may include further material 536 formed over chip 306, e.g. over first chip side 314 and over encapsulation material 304. Structure 332, including further material 536 may be formed between electrical interconnects 326. The higher CTI of further material 536 compared to encapsulation material 304 may increase creepage resistance between electrical interconnects 326.

Figure 6A:
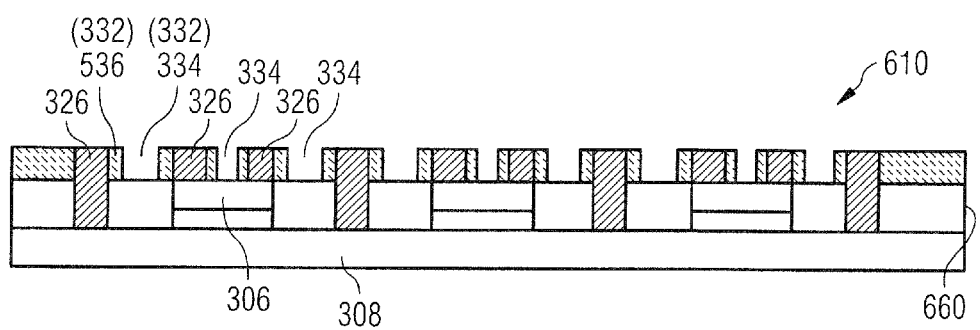
FIGS. 6A and 6B show a method for manufacturing an embedded integrated circuit package according to an embodiment.

FIG. 6A shows embedded integrated circuit package 660 according to an embodiment. Embedded integrated circuit package 660 may include one or more or all of the features already described according to embedded integrated circuit package 560. However, in addition, structure 332 may further include cavity 334 formed in further material 536.

Figure 6B:
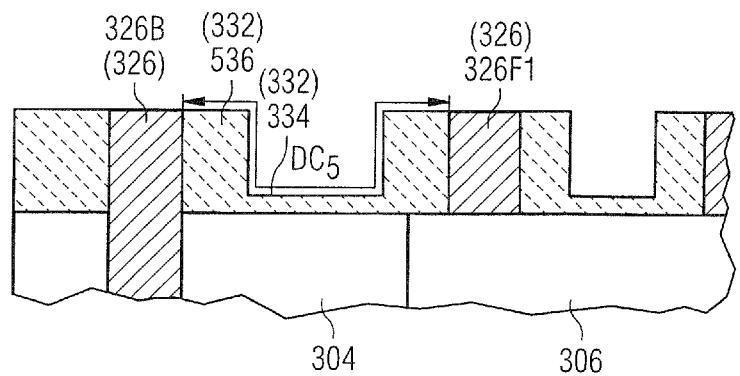

As shown in FIG. 6B, cavity 334 of structure 332, may increase the creepage distance, measured along the surface of further material 536, between electrical interconnects 328 to Dc5. Furthermore, further material 536 having a higher dielectric strength and/or higher comparative tracking index (CTI) than encapsulation material 30, may increase the overall creepage resistance between electrical interconnects 328.

Figure 7:
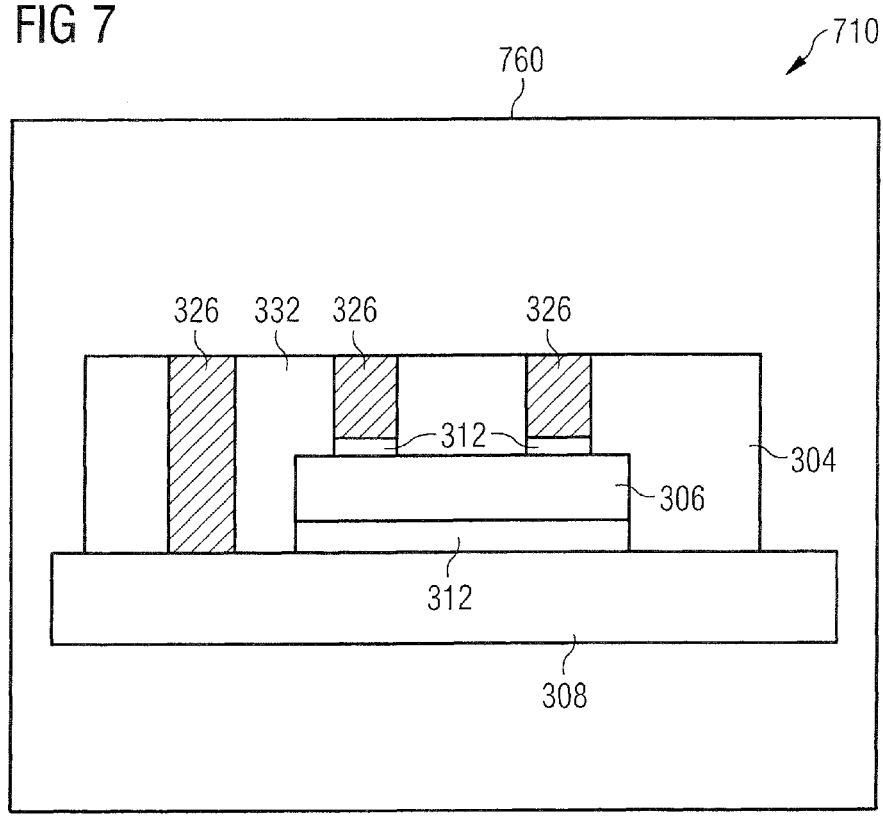
FIG. 7 shows an embedded integrated circuit package according to an embodiment.

FIG. 7 shows embedded integrated circuit package 760 according to an embodiment. Embedded integrated circuit package 760 may include: at least one chip 306 arranged over chip carrier 308, the at least one chip 306 including a plurality of chip contact pads 312; encapsulation material 304 formed over chip carrier 308 and at least partially surrounding the at least one chip 306; a plurality of electrical interconnects formed through encapsulation material 304, wherein each electrical interconnect 326 may be electrically connected to a chip contact pad 312; and structure 332 formed between electrical of embedded integrated circuit package 360, wherein structure 332 may increase the creepage resistance between electrical interconnects 326.

Various embodiments provide an embedded integrated circuit package including: at least one chip arranged over a chip carrier, the at least one chip including a plurality of chip contact pads; encapsulation material formed over the chip carrier and at least partially surrounding the at least one chip; a plurality of electrical interconnects formed through the encapsulation material, wherein each electrical interconnect is electrically connected to a chip contact pad; and a structure formed between the electrical interconnects of the embedded integrated circuit package, wherein the structure increases the creepage resistance between the electrical interconnects.

According to an embodiment, the at least one chip includes a power semiconductor chip.

According to an embodiment, the chip carrier includes an electrically conductive leadframe.

According to an embodiment, the plurality of chip contact pads include electrically conductive pads.

According to an embodiment, the encapsulation material includes an electrically insulating material.

According to an embodiment, the encapsulation material electrically insulates the plurality of electrical interconnects from each other.

According to an embodiment, the encapsulation material is formed over the chip and on one or more sidewalls of the at least one chip.

According to an embodiment, the plurality of electrical interconnects are formed over at least one of the at least one chip and the chip carrier.

According to an embodiment, the encapsulation material includes an electrically insulating laminate.

According to an embodiment, the encapsulation material includes an electrically insulating laminate including at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, the structure increases the creepage distance, measured along the surface of the encapsulation material, between the electrical interconnects.

According to an embodiment, the structure includes a cavity formed in the encapsulation material.

According to an embodiment, the structure includes further material formed over at least one of the chip and the chip carrier, the further material having a higher dielectric strength than the encapsulation material.

According to an embodiment, the structure includes a cavity formed in the encapsulation material between the electrical interconnects, and wherein further material at least partially fills the cavity, the further material having a higher dielectric strength than the encapsulation material.

According to an embodiment, the structure includes a cavity formed in the encapsulation material between the electrical interconnects, and wherein further material at least partially fills the cavity, the further material including at least one material from the following group of materials, the group of materials consisting of: glass, ceramics.

According to an embodiment, the structure includes a cavity formed in the encapsulation material between the electrical interconnects, and wherein further material at least partially fills the cavity forming a protrusion of the further material from the encapsulation material.

According to an embodiment, the structure is formed over at least one of the chip and the chip carrier.

According to an embodiment, the plurality of electrical interconnects are deposited in one or more holes formed in the encapsulation material, each hole releasing an electrical contact electrically connected to a chip contact pad.

According to an embodiment, the plurality of electrical interconnects are deposited in one or more holes formed in the encapsulation material, each hole releasing a contact pad from the encapsulation material.

According to an embodiment, a first electrical interconnect is electrically connected to a first chip contact pad formed on a first chip side; and a second electrical interconnect is electrically connected to a second chip contact pad formed on the first chip side or a second chip side, wherein the second chip side is formed on the chip carrier.

According to an embodiment, the embedded integrated circuit package further includes a first electrical interconnect electrically connected to a first chip contact pad formed on a first chip side; a second electrical interconnect electrically connected to a second chip contact pad is formed on the first chip side; and a third electrical interconnect electrically connected to a third chip contact pad formed on a second chip side via the chip carrier, wherein the second chip side is formed on the chip carrier.

According to an embodiment, the embedded integrated circuit package includes a wafer level package.

Various embodiments provide a method for manufacturing an embedded integrated circuit package, the method including: arranging a chip over a chip carrier, the chip including a plurality of chip contact pads; forming encapsulation material over the chip carrier and at least partially surrounding the chip; forming a plurality of electrical interconnects through the encapsulation material, thereby electrically connecting each electrical interconnect to a chip contact pad; and forming a structure between the electrical interconnects of the embedded integrated circuit package, wherein the structure increases the creepage resistance between the electrical interconnects.

According to an embodiment, arranging a chip over a chip carrier includes soldering a chip onto a chip carrier.

According to an embodiment, forming encapsulation material over the chip carrier and at least partially surrounding the chip includes laminating the encapsulation material over the chip and at least part of the chip carrier.

According to an embodiment, forming a plurality of electrical interconnects through the encapsulation material, includes depositing the electrical interconnects by galvanic electroplating.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An embedded integrated circuit package comprising:
    at least one chip arranged over a chip carrier, the at least one chip comprising a plurality of chip contact pads;
    encapsulation material formed over the chip carrier and at least partially surrounding the at least one chip;
    a plurality of electrical interconnects formed through the encapsulation material, wherein each electrical interconnect is electrically connected to a chip contact pad; and
    a structure formed between the electrical interconnects of the embedded integrated circuit package, wherein the structure increases the creepage resistance between the electrical interconnects.

2. The embedded integrated circuit package according to claim 1,
    wherein the at least one chip comprises a power semiconductor chip.

3. The embedded integrated circuit package according to claim 1,
    wherein the chip carrier comprises an electrically conductive leadframe.

4. The embedded integrated circuit package according to claim 1,
    wherein the encapsulation material comprises an electrically insulating material.

5. The embedded integrated circuit package according to claim 1,
    wherein the encapsulation material electrically insulates the plurality of electrical interconnects from each other.

6. The embedded integrated circuit package according to claim 1,
    wherein the encapsulation material is formed over the chip and on one or more sidewalls of the at least one chip.

7. The embedded integrated circuit package according to claim 1,
    wherein the plurality of electrical interconnects are formed over at least one of the at least one chip and the chip carrier.

8. The embedded integrated circuit package according to claim 1,
    wherein the encapsulation material comprises an electrically insulating laminate.

9. The embedded integrated circuit package according to claim 1,
    wherein the encapsulation material comprises an electrically insulating laminate comprising at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

10. The embedded integrated circuit package according to claim 1,
wherein the structure increases the creepage distance, measured along the surface of the encapsulation material, between the electrical interconnects.

11. The embedded integrated circuit package according to claim 1,
wherein the structure comprises a cavity formed in the encapsulation material.

12. The embedded integrated circuit package according to claim 1,
wherein the structure comprises
further material formed over at least one of the chip and the chip carrier, the further material having a higher dielectric strength than the encapsulation material.

13. The embedded integrated circuit package according to claim 1,
wherein the structure comprises
a cavity formed in the encapsulation material between the electrical interconnects, and
wherein further material at least partially fills the cavity, the further material having a higher dielectric strength than the encapsulation material.

14. The embedded integrated circuit package according to claim 1,
wherein the structure comprises
a cavity formed in the encapsulation material between the electrical interconnects, and
wherein further material at least partially fills the cavity, the further material comprising at least one material from the following group of materials, the group of materials consisting of: glass, ceramics.

15. The embedded integrated circuit package according to claim 1,
wherein the structure comprises
a cavity formed in the encapsulation material between the electrical interconnects, and
wherein further material at least partially fills the cavity forming a protrusion of the further material from the encapsulation material.

16. The embedded integrated circuit package according to claim 1,
wherein the structure is formed over at least one of the chip and the chip carrier.

17. The embedded integrated circuit package according to claim 1,
wherein the plurality of electrical interconnects are deposited in one or more holes formed in the encapsulation material, each hole releasing an electrical contact electrically connected to a chip contact pad.

18. The embedded integrated circuit package according to claim 1,
wherein a first electrical interconnect is electrically connected to a first chip contact pad formed on a first chip side; and
wherein a second electrical interconnect is electrically connected to a second chip contact pad formed on the first chip side or a second chip side, wherein the second chip side is formed on the chip carrier.

19. The embedded integrated circuit package according to claim 1, further comprising
a first electrical interconnect electrically connected to a first chip contact pad formed on a first chip side;
a second electrical interconnect electrically connected to a second chip contact pad is formed on the first chip side; and
a third electrical interconnect electrically connected to a third chip contact pad formed on a second chip side via the chip carrier, wherein the second chip side is formed on the chip carrier.

20. The embedded integrated circuit package according to claim 1,
wherein the embedded integrated circuit package comprises a wafer level package.

* * * * *